United States Patent
Kim

(10) Patent No.: US 11,233,073 B2
(45) Date of Patent: Jan. 25, 2022

(54) DISPLAY DEVICE INCLUDING A PATTERNED CONDUCTIVE LAYER

(71) Applicant: Samsung Display Co., Ltd., Yongin-Si (KR)

(72) Inventor: In Woo Kim, Asan-si (KR)

(73) Assignee: Samsung Display Co., Ltd.

( * ) Notice: Subject to any disclaimer, the term of this patent is extended or adjusted under 35 U.S.C. 154(b) by 68 days.

(21) Appl. No.: 16/683,081

(22) Filed: Nov. 13, 2019

(65) Prior Publication Data
US 2020/0152664 A1    May 14, 2020

(30) Foreign Application Priority Data
Nov. 14, 2018  (KR) .................. 10-2018-0139825

(51) Int. Cl.
*H01L 27/12*    (2006.01)
*G02F 1/1362*    (2006.01)

(52) U.S. Cl.
CPC ...... *H01L 27/124* (2013.01); *G02F 1/136286* (2013.01)

(58) Field of Classification Search
CPC ............... H01L 27/124; H01L 27/1288; G02F 1/136286; G02F 1/134345; G02F 1/13624; G02F 1/133707; G02F 1/134309; G02F 2201/508; G02F 1/136268; G02F 1/136259; G02F 1/1343; G02F 1/1368; G02F 1/136263; G02F 1/136272; G02F 1/13629; G02F 1/13695
See application file for complete search history.

(56) References Cited

U.S. PATENT DOCUMENTS

| | | | | |
|---|---|---|---|---|
| 5,886,757 | A | * | 3/1999 | Song ................. H01L 29/41733 349/43 |
| 6,337,234 | B2 | | 1/2002 | Ha et al. |
| 8,143,118 | B2 | | 3/2012 | Ohnuma et al. |
| 2003/0203627 | A1 | | 10/2003 | Pang |
| 2008/0252806 | A1 | | 10/2008 | Souk et al. |

(Continued)

FOREIGN PATENT DOCUMENTS

| CN | 105425435 A | 3/2016 |
|---|---|---|
| JP | 10-214972 A | 8/1998 |

(Continued)

OTHER PUBLICATIONS

Extended European Search Report corresponding to European Patent Application No. 19208709.6 dated Mar. 5, 2020 15 pages.

*Primary Examiner* — Victor A Mandala
(74) *Attorney, Agent, or Firm* — Innovation Counsel LLP

(57) ABSTRACT

A display device includes: a gate line including a gate line portion; a data line; a transistor including a gate electrode connected to the gate line, a source electrode connected to the data line, and a drain electrode; and a connecting member disposed between the data line and the source electrode, connected to the data line and the source electrode to cross a gate electrode edge of the gate electrode. A connecting portion where a data line edge and a connecting member edge are connected to each other does not overlap the gate line and the gate electrode in a plan view. The data line includes a first data line portion crossing the gate line and a second data line portion connected to the first data line portion and does not overlap the gate line in the plan view.

16 Claims, 12 Drawing Sheets

(56) References Cited

U.S. PATENT DOCUMENTS

| | | | |
|---|---|---|---|
| 2013/0092946 A1 | 4/2013 | Ma et al. | |
| 2014/0002434 A1* | 1/2014 | Park | G02F 1/1345 345/211 |
| 2017/0023837 A1* | 1/2017 | Shin | H01L 27/1259 |
| 2017/0104015 A1* | 4/2017 | Bae | H01L 29/66765 |
| 2017/0108736 A1* | 4/2017 | Jin | G02F 1/133345 |
| 2017/0363917 A1* | 12/2017 | Shin | G02F 1/1368 |
| 2019/0317373 A1* | 10/2019 | Kang | G02F 1/136259 |

FOREIGN PATENT DOCUMENTS

| | | |
|---|---|---|
| JP | 5841009 B2 | 1/2016 |
| KR | 10-2007-0109091 A | 11/2007 |
| KR | 10-2008-0030799 A | 4/2008 |
| KR | 10-2018-0062516 A | 6/2018 |

* cited by examiner

DISPLAY DEVICE INCLUDING A PATTERNED CONDUCTIVE LAYER

CROSS-REFERENCE TO RELATED APPLICATION

This application claims priority to and the benefit of Korean Patent Application No. 10-2018-0139825 filed in the Korean Intellectual Property Office on Nov. 14, 2018, the disclosure of which is incorporated herein by reference in its entirety.

BACKGROUND

(a) Technical Field

The present disclosure relates to a display device, more particularly, to a display device including a patterned conductive layer.

(b) Description of the Related Art

A display device such as a liquid crystal display (LCD) and an organic light emitting diode (OLED) display includes a display panel including a plurality of pixels displaying images, and a plurality of signal lines. Each pixel may include a pixel electrode receiving a data signal, and the pixel electrode may be connected to at least one transistor to receive the data signal. The display panel may include a plurality of layers stacked on a substrate.

The plurality of layers of the display panel that are stacked on the substrate may be patterned into various shapes through a patterning process such as a photolithography process.

The above information disclosed in this Background section is only for enhancement of understanding of the background of the present disclosure, and therefore, it may contain information that does not form the prior art that is already known to a person of ordinary skill in the art.

SUMMARY

The present disclosure provides a display device and a manufacturing method of the same. The display device includes a conductive layer having an improved pattern accuracy, thereby increasing a success rate for repairing a defective pixel and improving a display quality by reducing or preventing a leakage current through a transistor.

A display device according to an exemplary embodiment of the present disclosure includes: a gate line including a gate line portion and extending in a first direction; a data line extending in a second direction crossing the first direction; a transistor including a gate electrode connected to the gate line, a source electrode connected to the data line, and a drain electrode; and a connecting member disposed between the data line and the source electrode, connected to the data line and the source electrode, and extending in the first direction to cross a gate electrode edge of the gate electrode, wherein a connecting portion where a data line edge of the data line and a connecting member edge of the connecting member are connected to each other does not overlap the gate line and the gate electrode in a plan view, wherein the data line includes a first data line portion crossing the gate line and a second data line portion that is connected to the first data line portion and does not overlap the gate line in the plan view, wherein the second data line portion includes the connecting portion, and wherein a first width of the first data line portion is greater than a second width of the second data line portion.

The second data line portion of the data line is included in a region enclosed by the data line, the connecting member, the gate electrode edge, and the gate line portion of the gate line.

The data line may include two facing data line edges, and a first data line edge of the two facing data line edges may be directly connected to the connecting member and may be bent at a position where the first data line portion and the second data line portion are connected to form a curved edge.

The display device may further include a semiconductor layer overlapping the data line, the connecting member, the source electrode, and the drain electrode, and the semiconductor layer may include a channel region disposed between the source electrode and the drain electrode.

The gate line portion of the gate line may include a first gate line portion and a second gate line portion facing each other with respect to the second data line portion.

The connecting member may include a first connecting member portion connected to the data line and a second connecting member portion disposed between the first connecting member portion and the source electrode, and a third width of the first connecting member portion may be smaller than a fourth width of the second connecting member portion.

The first connecting member portion may not overlap the gate electrode in the plan view, and the first connecting member portion of the connecting member is included in region enclosed by the data line, the connecting member, the gate electrode edge, and the gate line portion of the gate line.

The second connecting member portion may cross the gate electrode edge.

The gate line portion of the gate line may be bent to form a curved edge.

The gate line portion may have a uniform width.

The curved edge of the gate line portion of the gate line may be included in a region enclosed by the data line, the connecting member, the gate electrode edge, and the gate line portion of the gate line.

A display device according to an exemplary embodiment includes: a gate line including a gate line portion and extending in a first direction; a data line extending in a second direction crossing the first direction; a transistor including a gate electrode connected to the gate line, a source electrode connected to the data line, and a drain electrode; and a connecting member disposed between the data line and the source electrode, connected to the data line and the source electrode, and extending in the first direction to cross a gate electrode edge of the gate electrode, wherein a connecting portion where a data line edge of the data line and a connecting member edge of the connecting member are connected to each other does not overlap the gate line and the gate electrode in a plan view, wherein the connecting member includes a first connecting member portion connected to the data line and a second connecting member portion disposed between the first connecting member portion and the source electrode, wherein the first connecting member portion includes the connecting portion, and wherein a first width of the first connecting member portion is smaller than a second width of the second connecting member portion.

The first connecting member portion may not overlap the gate electrode in the plan view.

The first connecting member portion of the connecting member may be included in a region enclosed by the data line, the connecting member, the gate electrode edge, and the gate line portion of the gate line.

The second connecting member portion may cross the gate electrode edge.

The gate line portion of the gate line may include a first gate line portion and a second gate line portion facing each other with respect to the first connecting member portion.

A display device according to an exemplary embodiment includes: a gate line including a gate line portion and extending in a first direction; a data line extending in a second direction crossing the first direction; a transistor including a gate electrode connected to the gate line, a source electrode connected to the data line, and a drain electrode; and a connecting member disposed between the data line and the source electrode, connected to the data line and the source electrode, and extending in the first direction to cross a gate electrode edge of the gate electrode, wherein a connecting portion where a data line edge of the data line and a connecting member edge of the connecting member are connected to each other does not overlap the gate line and the gate electrode in a plan view, and wherein the gate line portion of the gate line is bent to form a curved edge.

The gate line portion may have a uniform width.

The curved edge of the gate line portion of the gate line may be included in a region enclosed by the data line, the connecting member, the gate electrode edge, and the gate line portion of the gate line.

The gate line portion of the gate line may include a first gate line portion and a second gate line portion facing each other with respect to the connecting portion.

DETAILED DESCRIPTION OF THE EMBODIMENTS

Figure 1:
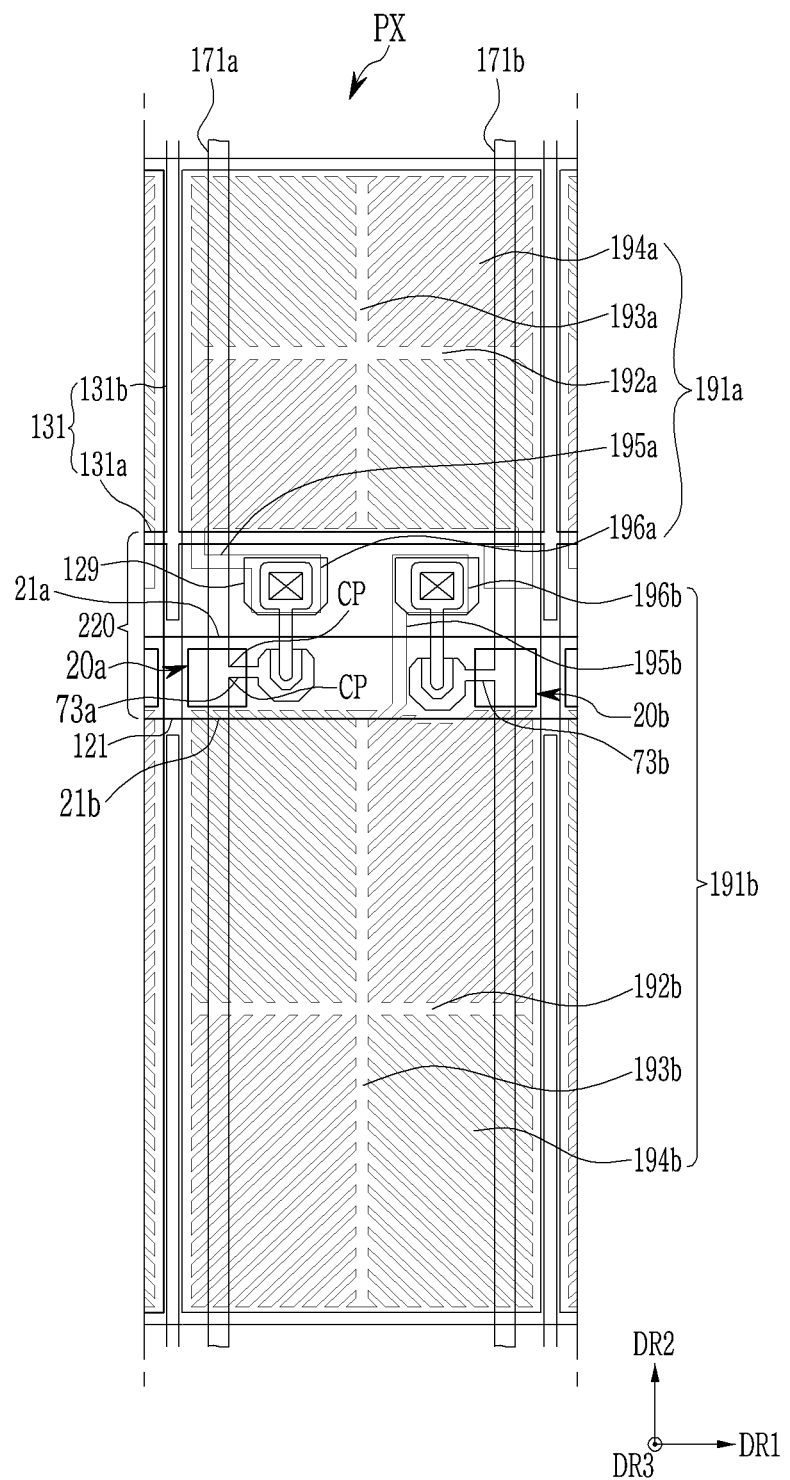
FIG. 1 is a layout view of one pixel of a display device according to an exemplary embodiment.

The present disclosure will be described more fully hereinafter with reference to the accompanying drawings, in which exemplary embodiments of the present disclosure are shown. As those skilled in the art would realize, the described embodiments may be modified in various different ways and forms, without departing from the spirit or scope of the present disclosure.

The drawings and description are to be regarded as illustrative in nature and not restrictive. Like reference numerals designate like elements throughout the specification.

Further, in the drawings, a size and thickness of each element are arbitrarily represented for better understanding and ease of description, and the present disclosure is not limited thereto. In the drawings, the thickness of layers, films, panels, regions, etc., are exaggerated for clarity, better understanding, and ease of description.

It will be understood that when an element such as a layer, film, region, or substrate is referred to as being "on" another element, it can be directly on the other element or one or more intervening elements may also be present therebetween. In contrast, when an element is referred to as being "directly on" another element, there may be no intervening elements present therebetween. Further, in the specification, the word "on" or "above" means positioned on or below an object portion, and does not necessarily mean positioned on an upper side of the object portion based on a gravitational direction.

In addition, unless explicitly described to the contrary, the word "comprise" and its variations such as "comprises" or "comprising" will be understood to imply an inclusion of stated elements but not an exclusion of any other elements.

Throughout this specification and the claims which follow, a plan view means a view when observing a surface parallel to two directions (e.g., a first direction DR1 and a second direction DR2) crossing each other, and a cross-sectional view means a view when observing a surface cut in a direction (e.g., a third direction DR3) perpendicular to the surface parallel to the first direction DR1 and the second direction DR2. In addition, overlapping two elements means that two elements may overlap with each other in the third direction DR3 (e.g., a direction perpendicular to an upper surface of the substrate) unless stated otherwise.

First, a structure of the display device according to an exemplary embodiment is described with reference to FIG. 1 to FIG. 3.

Figure 2:
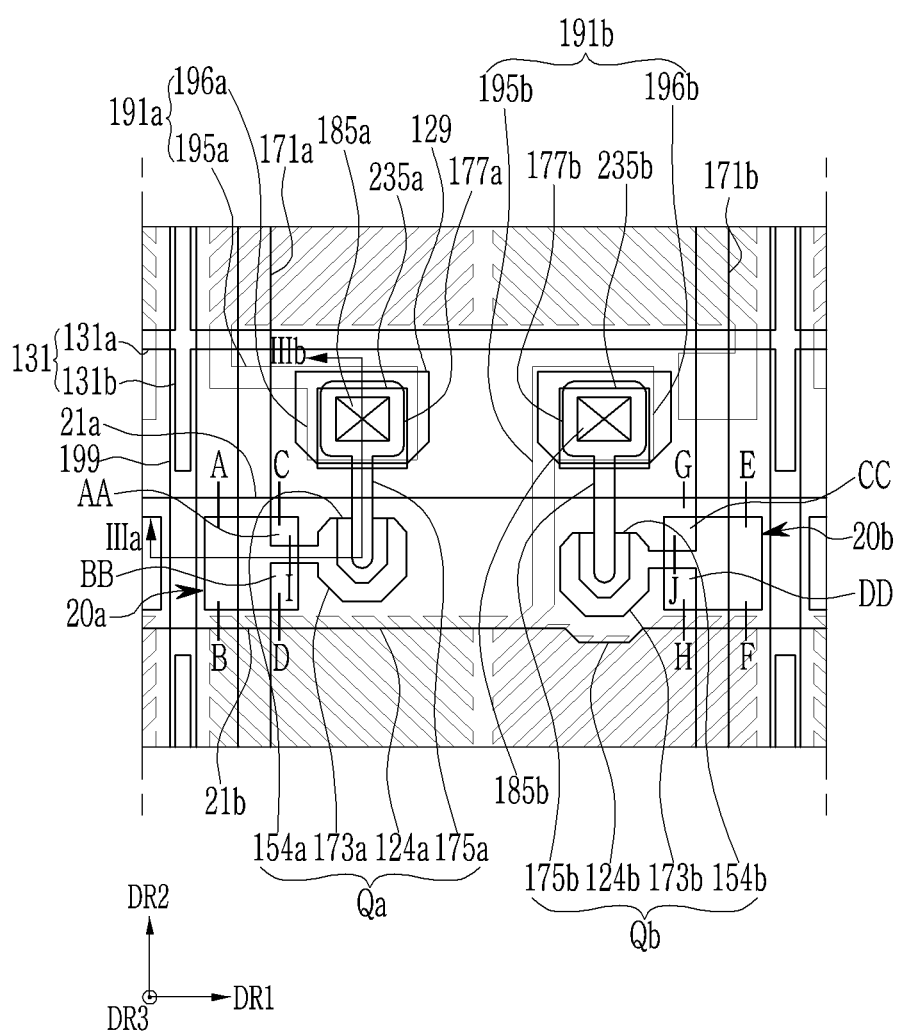
FIG. 2 is an enlarged view of a part of the display device shown in FIG. 1.
Figure 3:
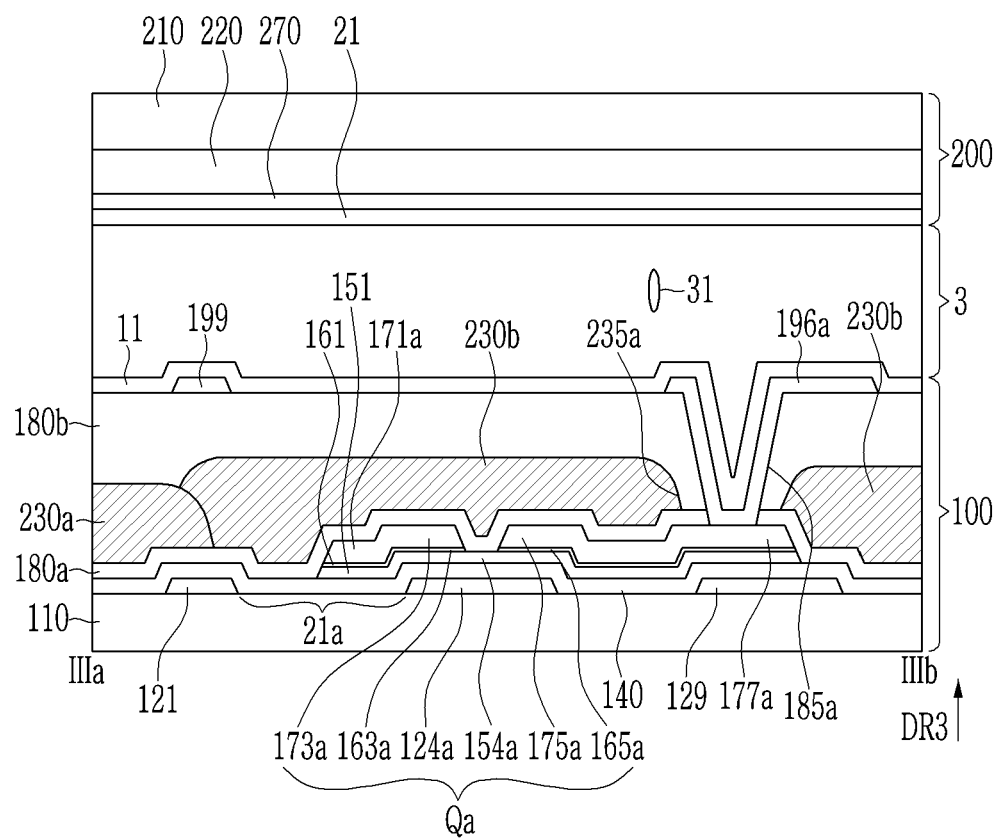
FIG. 3 is a cross-sectional view of the display device shown in FIG. 2 taken along a line IIIa-IIIb.

FIG. 1 is a layout view of one pixel of a display device according to an exemplary embodiment, FIG. 2 is an enlarged view of a part of the display device shown in FIG. 1, and FIG. 3 is a cross-sectional view of the display device shown in FIG. 2 taken along a line IIIa-IIIb.

A display device according to an exemplary embodiment may be one of a variety of display devices, for example, a liquid crystal display. The display device according to an exemplary embodiment, as shown in FIG. 3, may include a first display panel 100 and a second display panel 200, and a liquid crystal layer 3 disposed between the two display panels 100 and 200 in a cross-sectional view.

The display device includes a display area for displaying an image in a plan view, and the display area includes a plurality of pixels PX.

The first display panel 100 includes a substrate 110, a gate conductive layer including a gate line 121, a storage electrode line 131, and a dummy pattern 129 that are disposed on the substrate 110. The substrate 110 may be made of an insulating material such as glass, plastic, and the like.

The gate line 121 may mainly extend in the first direction DR1, and may transmit a gate signal. The gate line 121 may include a first gate electrode 124a and a second gate electrode 124b that are disposed in a pixel PX. The first gate electrode 124a and the second gate electrode 124b may be disposed to be adjacent to each other in the first direction DR1 and connected to each other. The gate line 121 may include one or more line portions that is/are connected to the first and second gate electrodes 124a and 12b, and the line portion of the gate line 121 may cross first and second data lines 171a and 171b. The first and second data lines 171a and 171b may be collectively referred to as a data line 171. In some embodiments, the gate line 121 may be connected to the first gate electrode 124a and the second gate electrode 124b via the above-described line portion(s). According to one embodiment, an edge of the first and second gate electrodes 124a and 124b may be directly connected to the line portion of the gate line 121 at a right angle and extend in the second direction DR2.

Referring to FIG. 2, a lower edge of the second gate electrode 124b may have a portion that is protruded downward (in the second direction DR2), whereas a lower edge of the line portion of the gate line 121 extends in the first direction DR1 without a protruded portion. In this case, as shown in FIG. 1, the lower edge of the second gate electrode 124b including the protruded portion may be disposed to overlap a light blocking member 220, which will be described later.

The gate line 121 may include openings 20a and 20b disposed corresponding to the pixel PX. The opening 20a may be disposed to be adjacent to the left side of the first gate electrode 124a, and the opening 20b may be disposed to be adjacent to the right side of the second gate electrode 124b. Accordingly, the gate line 121 may include two line portions 21a and 21b that are disposed above and below the openings 20a and 20b facing each other. The opening 20a and the opening 20b may have the same shape and size. The line portions 21a and 21b of the gate line 121 may cross the first and second data lines 171a and 171b.

The storage electrode line 131 may include a transverse part 131a extending substantially parallel to the gate line 121 (e.g., in the first direction DR1) and a longitudinal part 131b connected to the transverse part 131a. The longitudinal part 131b of the storage electrode line 131 may extend along the edge of the pixel PX (e.g., in the second direction DR2).

The dummy pattern 129 may be disposed between the transverse part 131a of the storage electrode line 131 and the gate line 121. According to one embodiment, a pair of dummy patterns 129 may be disposed in the pixel PX. In this case, each dummy pattern of the pair of dummy patterns 129 may have an island shape disposed in the pixel PX.

A gate insulating layer 140 is disposed on the gate conductive layer. The gate insulating layer 140 may include an insulating material such as a silicon nitride ($SiN_x$), a silicon oxide ($SiO_x$), a silicon oxynitride ($SiO_xN_y$), etc.

A semiconductor layer 151 including a first semiconductor 154a and a second semiconductor 154b is disposed on the gate insulating layer 140. The first semiconductor 154a may overlap the first gate electrode 124a, and the second semiconductor 154b may overlap the second gate electrode 124b.

The semiconductor layer 151 may include amorphous silicon, polycrystalline silicon, a metal oxide, etc.

An ohmic contact layer 161 including one or more ohmic contacts may be disposed on the semiconductor layer 151. In one embodiment, a pair of ohmic contacts 163a and 165a may be disposed on the first semiconductor 154a, and another pair of ohmic contacts may be disposed on the second semiconductor 154b. In one embodiment, the ohmic contact layer 161 may be made of a material such as n+ hydrogenated amorphous silicon in which an n-type impurity such as a phosphor is doped with a high density, or a silicide. In some embodiments, the ohmic contact layer 161 may be omitted.

A data conductive layer may be disposed on the ohmic contact layer 161. The data conductive layer may include a plurality of data lines including the first data line 171a and the second data line 171b, a plurality of source electrodes including a first source electrode 173a and a second source electrode 173b, a plurality of connecting members 73a and 73b, and a plurality of drain electrodes including a first drain electrode 175a and a second drain electrode 175b.

The first data line 171a and the second data line 171b transmit a data signal and mainly extend in the second direction DR2, thereby crossing the gate line 121 and the transverse part 131a of the storage electrode line 131.

The first data line 171a and the second data line 171b corresponding to the pixel PX may respectively transmit the data signal having data voltages for representing different luminance for one image. For example, a data voltage transmitted by the second data line 171b for the image (e.g., in a gray scale) may be equal to or lower than another data voltage transmitted by the first data line 171a. The first and second data lines 171a and 171b disposed in each of the adjacent pixels PX may transmit a different data signal for another image.

The first source electrode 173a overlaps at least a portion of the first gate electrode 124a in a plan view and is connected to the first data line 171a. The second source electrode 173b overlaps at least a portion of the second gate electrode 124b in a plan view and is connected to the second data line 171b. Each of the first and second source electrodes 173a and 173b may be bent in a U-shape.

The first source electrode 173a may be connected to the first data line 171a through the connecting member 73a, and the connecting member 73a may be directly connected to the first data line 171a. Similarly, the second source electrode 173b may be connected to the second data line 171b through the connecting member 73b, and the connecting member 73b may be directly connected to the second data line 171b. Each of the connecting members 73a and 73b may be connected to the first and second data lines 171a and 171b and disposed between a respective one of the data lines 171a and 171b and a respective one of the source electrodes 173a and 173b. Each of the connecting members 73a and 73b mainly extend in the first direction DR1, thereby crossing the edge of the first and second gate electrodes 124a and 124b. That is, each of the connecting members 73a and 73b may include a region that overlaps the first and second gate electrode 124a and 124b and another region that does not overlap the gate electrode 124a and 124b in a plan view that are separated by the edge of the gate electrode 124a and 124b.

Figure 4:
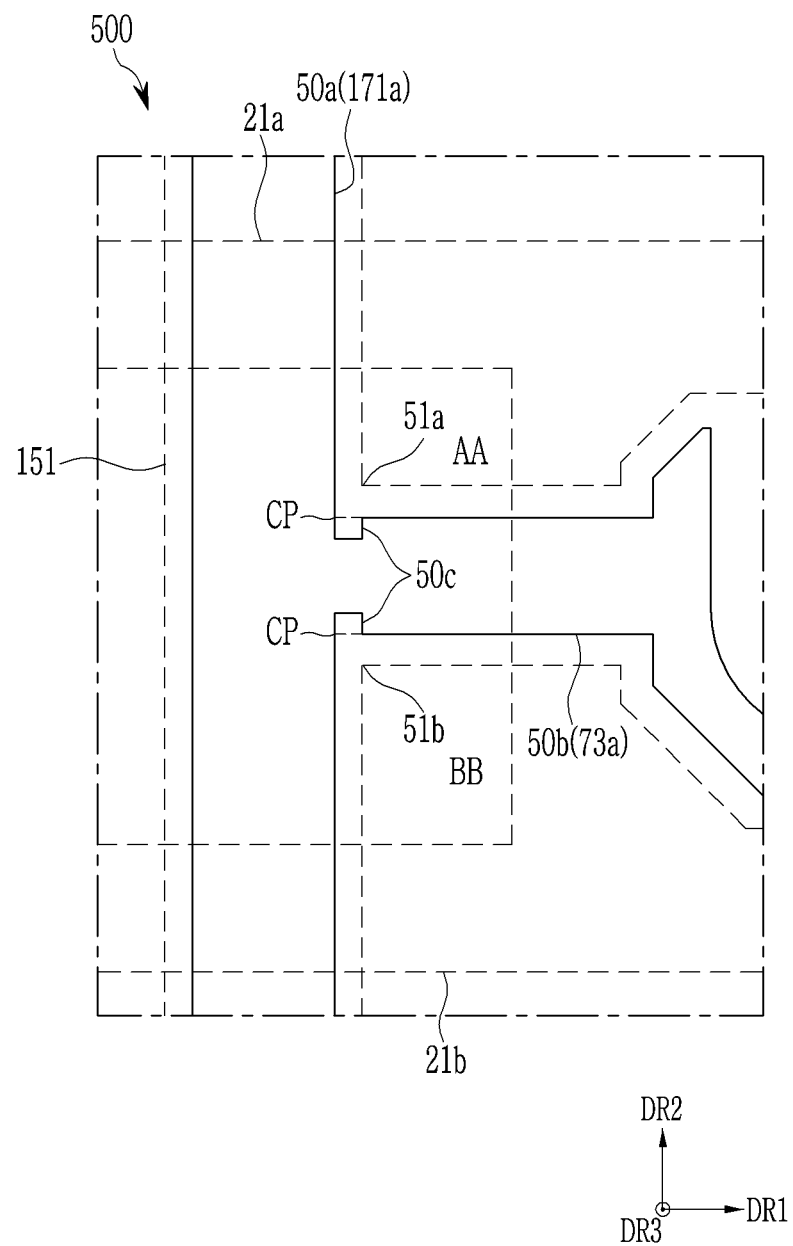
FIG. 4 is a top plan view showing a planar structure of a part of a photomask used in a manufacturing process of a display device according to an exemplary embodiment, and a pattern of the display device corresponding thereto.

Each of the connecting members 73a and 73b may extend from the first and second data lines 171a and 171b substantially perpendicular to the first and second data lines 171a and 171b. A portion where the connecting members 73a and 73b and the edge of the data lines 171a and 171b are connected is referred to as a connecting portion CP as shown in FIG. 4. The connecting portion CP may have a largest curvature radius.

If the connecting members 73a and 73b are perfectly perpendicularly connected to the first and second data lines 171a and 171b, then the connecting portion CP may form a perfectly right angle. The connecting portion CP may be separated from the gate line 121 and the gate electrodes 124a and 124b without overlapping them in a plan view. In one embodiment, the connecting portion CP may overlap one of the openings 20a and 20b in a plan view.

The first drain electrode 175a and the second drain electrode 175b may include one end with a bar shape and a wide end with a first expansion 177a and a second expansion 177b, respectively. The first and second expansions 177a and 177b of the first drain electrode 175a and the second drain electrode 175b may be disposed between the storage electrode line 131 and the gate line 121.

Each of the first and second drain electrodes 175a and 175b may overlap at least a portion of the dummy pattern 129 of the gate conductive layer. The end of the bar shape of the first drain electrode 175a and the second drain electrode 175b may be partially enclosed by the first source electrode 173a and the second source electrode 173b, respectively in a plan view.

The first gate electrode 124a, the first source electrode 173a, and the first drain electrode 175a form a first transistor Qa along with the first semiconductor 154a, and the second gate electrode 124b, the second source electrode 173b, and the second drain electrode 175b form a second transistor Qb along with the second semiconductor 154b. A channel of the first transistor Qa may be formed in the first semiconductor 154a and disposed between the first source electrode 173a and the first drain electrode 175a. the second semiconductor 154b and disposed between the second source electrode 173b and the second drain electrode 175b. A channel region of the first and second transistors Qa and Qb may correspond to the first semiconductor 154a and the second semiconductor 154b, respectively.

In a plan view, the semiconductor layer 151 may be disposed to overlap a region where the data conductive layer is disposed. That is, the semiconductor layer 151 may be disposed to overlap the data conductive layer from below. In a plan view, a shape of the data conductive layer may be similar to that of the semiconductor layer 151 except for the channel region of the first and second transistors Qa and Qb. In a plan view, a planar size of the data conductive layer may be equal to or smaller than a planar size of the semiconductor layer 151 except for the channel region of the first and second transistors Qa and Qb. When the planar size of the data conductive layer is equal to the planar size of the semiconductor layer 151 excluding the channel region of the first and second transistors Qa and Qb, an edge of the data conductive layer may be substantially aligned with an edge of the semiconductor layer 151, thereby coinciding with each other in a plan view. When the planar size of the data conductive layer is smaller than the planar size of the semiconductor layer 151 except for the channel region of the first and second transistors Qa and Qb, the edge of the data conductive layer may be located inside the edge of the semiconductor layer 151 in a plan view and extend substantially in parallel to the edge of the semiconductor layer 151.

In this case, in a manufacturing process of the display device, the data conductive layer, the ohmic contact layer 161, and the semiconductor layer 151 may be formed through a photolithography process using one photomask including a half-tone region.

The first and second transistors Qa and Qb disposed in the pixel PX may be arranged in the first direction DR1 in which the gate line 121 extends. In addition, in a plan view, the first and second transistors Qa and Qb may be disposed between the first data line 171a and the second data line 171b corresponding to the pixel PX.

The first and second transistors Qa and Qb may serve as switching elements for transmitting the data signal transmitted by the first and second data lines 171a and 171b according to the gate signal transmitted by the gate line 121.

The opening 20a of the gate line 121 may overlap a part of the first data line 171a and a part of the connecting member 73a, and the opening 20b of the gate line 121 overlaps a part of the second data line 171b and a part of the connecting member 73b.

A region where the gate line 121, the transverse part 131a of the storage electrode line 131, and the first and second transistors Qa and Qb are disposed may be covered by the light blocking member 220. The light blocking member 220 may substantially extend in the first direction DR1 to form a light blocking region of the pixel PX.

A first insulating layer 180a may be disposed on the data conductive layer. The first insulating layer 180a may include an organic insulating material or an inorganic insulating material.

A plurality of color filters 230a and 230b may be disposed on the first insulating layer 180a.

Each of the color filters 230a and 230b may display one among primary colors such as three primary colors of red, green, and blue, or four primary colors including the same or different colors. It is noted that the color filters 230a and 230b are not limited to the three primary colors including red, green, and blue and may display other primary colors such as cyan, magenta, yellow, and white. The color filters 230a and 230b respectively corresponding to the pixels PX that are adjacent in the first direction DR1 may represent different colors. In a non-limiting example, the color filter 230a may represent red, and the color filter 230b may represent green.

Each of the color filters 230a and 230b may extend in the second direction DR2 to correspond to a plurality of pixels PX disposed in a column.

Two or more color filters 230a and 230b may overlap with each other between two pixels PX that are adjacent in the first direction DR1, and two color filters 230a and 230b overlapping with each other may serve as a light blocking member (in addition to the light blocking member 220) for preventing light leakage between two adjacent pixels PX.

Each of the color filters 230a and 230b may include openings 235a and 235b respectively overlapping the expansions 177a and 177b of the first and second drain electrodes 175a and 175b.

A second insulating layer 180b may be disposed on the color filters 230a and 230b. The second insulating layer 180b may include an inorganic insulating material or an organic insulating material. In particular, the second insulating layer 180b including the organic insulating material may facilitate forming a substantially flat upper surface.

The first insulating layer 180a and the second insulating layer 180b may have a contact hole 185a exposing at least a portion of the first expansion 177a of the first drain electrode 175a and a contact hole 185b exposing at least a portion of the second expansion 177b of the second drain electrode 175b. In a plan view, the contact holes 185a and 185b may be respectively disposed in the openings 235a and 235b of the color filters 230a and 230b.

A pixel electrode layer including a pixel electrode and a shielding electrode 199 may be disposed on the second insulating layer 180b. The pixel electrode may include a plurality of sub-pixel electrodes including a first sub-pixel electrode 191a and a second sub-pixel electrode 191b. The first sub-pixel electrode 191a may be disposed at one side of the pixel PX, and the second sub-pixel electrode 191b may be disposed at the other side of the pixel PX corresponding to the first and second transistors Qa and Qb.

Each of the first sub-pixel electrode 191a and the second sub-pixel electrode 191b may have a quadrangular shape in a plan view. The first sub-pixel electrode 191a may include a cross-shaped stem including a transverse stem 192a and a longitudinal stem 193a crossing each other, and a plurality of branches 194a extending from the cross-shaped stem. Similarly, the second sub-pixel electrode 191b may include a cross-shaped stem including a transverse stem 192b and a longitudinal stem 193b crossing each other, and a plurality of branches 194b extending from the cross-shaped stem.

According to one embodiment, a size of the first sub-pixel electrode 191a in a plan view may be smaller than a size of the second sub-pixel electrode 191b in a plan view as shown in FIG. 1. In other embodiments, the first sub-pixel electrode 191a and the second sub-pixel electrode 191b may have the substantially same size, or the size of the second sub-pixel electrode 191b may be smaller than the size of the first sub-pixel electrode 191a.

The first sub-pixel electrode 191a may include an extending part 195a that protrudes toward the first expansion 177a of the first drain electrode 175a and a contact portion 196a connected to an end of the extending part 195a, and the second sub-pixel electrode 191b may include an extending part 195b that protrudes toward the second expansion 177b of the second drain electrode 175b and a contact portion 196b connected to an end of the extending part 195b. The contact portion 196a may be electrically connected to the first expansion 177a of the first drain electrode 175a through the contact hole 185a, and the contact portion 196b may be electrically connected to the second expansion 177b of the second drain electrode 175b through the contact hole 185b.

If the first transistor Qa and the second transistor Qb are turned on, the first sub-pixel electrode 191a and the second sub-pixel electrode 191b may receive the data signal from the first drain electrode 175a and the second drain electrode 175b, respectively.

The shielding electrode 199 may extend in the second direction DR2 between the pixels PX that are adjacent to one another in the first direction DR1, thereby preventing coupling and light leakage between the adjacent pixels PX. The shielding electrode 199 may overlap at least a portion of the longitudinal part 131b of the storage electrode line 131.

The pixel electrode layer may include a transparent conductive material such as indium-tin oxide (ITO), indium-zinc oxide (IZO), a metal thin film, etc.

An arrangement and a shape of the pixels PX, a structure of the first and second transistors Qa and Qb, and a shape of the pixel electrode described in the present exemplary embodiment are only an example, and numerous variations thereof are possible without deviating from the scope of the present disclosure.

An alignment layer 11 may be disposed (e.g., coated by a coating process) on the pixel electrode layer and the second insulating layer 180b. The alignment layer 11 may be a vertical alignment layer. The alignment layer 11 may be rubbed in at least one direction, or may be a photo-alignment layer including a photo-reactive material.

The second display panel 200 may include a substrate 210, the light blocking member 220 disposed on the substrate 210 (or under the substrate 210 as shown in FIG. 3). The substrate 210 may include an insulating material such as glass, plastic, etc. As above-described, the light blocking member 220 includes a part extending in the first direction DR1, and may overlap the first and second transistors Qa and Qb included in the pixel PX. According to another exemplary embodiment, the light blocking member 220 may be disposed in the first display panel 100, not in the second display panel 200.

A common electrode 270 may be disposed on the light blocking member 220 (or under the light blocking member 220 as shown in FIG. 3). The common electrode 270 may be formed continuously over an entire surface of the substrate 210. That is, the common electrode 270 may be formed without a pattern such as a slit, etc. The common electrode 270 may transmit a common voltage Vcom of a predetermined magnitude.

The common electrode 270 may include a transparent conductive material such as ITO, IZO, a metal thin film, etc.

An alignment layer 21 may be disposed (e.g., coated by a coating process) on the common electrode 270 (or under the common electrode 270 as shown in FIG. 3). The alignment layer 21 may be a vertical alignment layer. The alignment layer 21 may be rubbed in at least one direction, and may be a photo-alignment layer including a photo-reactive material. In one embodiment, the alignment layers 11 and 21 may be formed o the same photo-alignment layer including the same photo-reactive material.

The liquid crystal layer 3 includes a plurality of liquid crystal molecules 31. The liquid crystal molecules 31 may have negative dielectric anisotropy, and may be aligned substantially vertically with respect to the substrates 110 and 210 when no electric field is generated in the liquid crystal layer 3. The liquid crystal molecules 31 may be pre-tilted in a predetermined direction when no electric field is generated in the liquid crystal layer 3. For example, the liquid crystal molecules 31 may be pre-tilted in a direction substantially parallel with the branches 194a and 194b of the first and second sub-pixel electrodes 191a and 191b.

A backlight supplying light may be disposed on or at a rear side of the first display panel 100.

During the manufacturing process of the display device, a repair may be required for a defective pixel PX. I In one exemplary embodiment, a laser may be irradiated to at least a part among portions A, B, C, D, E, F, G, and H) of the line portions 21a and 21b of the gate line 121 shown in FIG. 2 through the openings 20a and 20b to electrically separate and disconnect the first transistor Qa and/or the second transistor Qb from the gate line 121 that transmits the gate signal, thereby repairing the defective pixel PX by turning it off. Together with this, or separately, a laser may be irradiated to a portion (I) of the connecting member 73a of the first source electrode 173a and/or a portion (J) of the connecting member 73b of the second source electrode 173b through the openings 20a and 20b to electrically separate the first transistor Qa and/or the second transistor Qb from the data lines 171a and 171b, thereby repairing the defective pixel PX by turning it off. The laser may be irradiated from the bottom of the substrate 110 shown in FIG. 3.

During the repair process, the laser needs to be accurately irradiated to an intended location (e.g., portions A, B, C, D, E, F, G, H, I, and J). However, in the absence of a precisely formed pattern (e.g., a corner pattern 50c shown in FIG. 4) at the connecting portion CP that corresponds to the portion where the data lines 171a and 171b and the connecting members 73a and 73b are connected together, an edge near the connecting portion CP may be formed to have a rounded shape. In this case, regions AA, BB, CC, and DD that are enclosed by the data lines 171a and 171b, the connecting members 73a and 73b, and the line portions 21a and 21b of the gate line 121 in the openings 20a and 20b may be reduced making it difficult to obtain a sufficient margin for securing a space required for the laser irradiation. As a result, the accuracy of the laser irradiation may be compromised, and a rate for successfully repairing the pixel PX may be lowered.

Particularly, when patterning the data conductive layer, the ohmic contact layer 161, and the semiconductor layer 151 by a photolithography process using one photomask, the semiconductor layer 151 disposed at the bottom of these layers may be formed to protrude outwardly from an edge of the data conductive layer in a region where the data lines 171a and 171b and the connecting members 73a and 73b are connected. As a result, the regions AA, BB, CC, and DD in the openings 20a and 20b may be further reduced so that a sufficient space required for laser irradiation may not be obtained. In addition, if the semiconductor layer 151 excessively protrudes outwardly from the edge of the data conductive layer at or near the connecting portion CP where the data lines 171a and 171b and the connecting member 73a and 73b are connected, a leakage current through the first and second transistors Qa and Qb may be increased by light that may reach the protruded portion of the semiconductor layer 151. Then, display quality defects such as stains may occur.

Various exemplary embodiments for preventing these problems, issues, and defects are described with reference to FIG. 4 to FIG. 12 along with FIG. 1 to FIG. 3 described above.

FIG. 4 is a top plan view together showing a planar structure of a part of a photomask 500 used in a manufacturing process of a display device according to an exemplary embodiment and a pattern (indicated by a dotted line) of the display device corresponding thereto.

A photoresist is coated for patterning the data conductive layer, the ohmic contact layer 161, and the semiconductor layer 151. The photomask 500 may include a region 50a and a region 50b respectively corresponding to the data line 171a and the connecting member 73a shown in FIG. 4. In a case of a negative type of photoresist, the regions 50a and 50b of the photomask 500 may correspond to light transmission regions transmitting light, and a remaining region may correspond a light blocking region, and in a case of a positive type of photoresist, the regions 50a and 50b of the photomask 500 may correspond to light blocking regions, and the remaining region may correspond to the light transmission region. In the present exemplary embodiment, a negative photoresist is taken as an example.

According to one embodiment, the photomask 500 may include a corner pattern 50c corresponding to the connecting portion CP. The corner pattern 50c may have various shapes for optical proximity correction (OPC) for preventing the connecting portion CP from being patterned to be rounded. For example, the corner pattern 50c may be a polygon such as a quadrangle or a triangle, or a circle. The corner pattern 50c may have a concave shape that is recessed inwardly from the edge of the connecting portion CP of the data conductive layer.

According to one embodiment, the connecting portion CP that is formed through developing and etching processes after irradiating light through the photomask 500 including the corner pattern 50c may have a shape having a substantially sharp perpendicular angle as shown in FIG. 4. The semiconductor layer 151 may have edges that are substantially parallel to the edges that are formed by the first and second data lines 171a and 171b and the connecting members 73a and 73b. Among these edges of the semiconductor layer 151, curved edges 51a and 51b that are sharply bent corresponding to the connecting portion CP may also have a concave shape. In addition, when the display device is completely manufactured, the regions AA and BB enclosed by the data lines 171a and 171b, the connecting members 73a and 73b, and the line portions 21a and 21b of the gate line 121 may not be reduced, and even if they are reduced, the amount of reduction in the regions AA and BB may be insignificant compared to a case where no corner pattern 50c is formed. Accordingly, the patterning accuracy of the data conductive layer, the ohmic contact layer 161, and the semiconductor layer 151 near the connecting portion CP may be improved, and a sufficient margin for securing a space required for the laser irradiation in a repair process of the pixel PX may be obtained, thereby maintaining or increasing a success rate for repairing the pixel PX. Further, the undesirable outward protrusion of the semiconductor layer 151 may be suppressed or prevented near the connecting portion CP, thereby reducing or preventing the leakage current through the transistors Qa and Qb.

FIG. 5, FIG. 6, FIG. 7, and FIG. 8 are enlarged top plan views of a part of one pixel of a display device according to various exemplary embodiments. For the convenience of explanation, description of the repeated components, layers, patterns, features, etc. are omitted, and only differences from the embodiments described above may be described.

Figure 5:
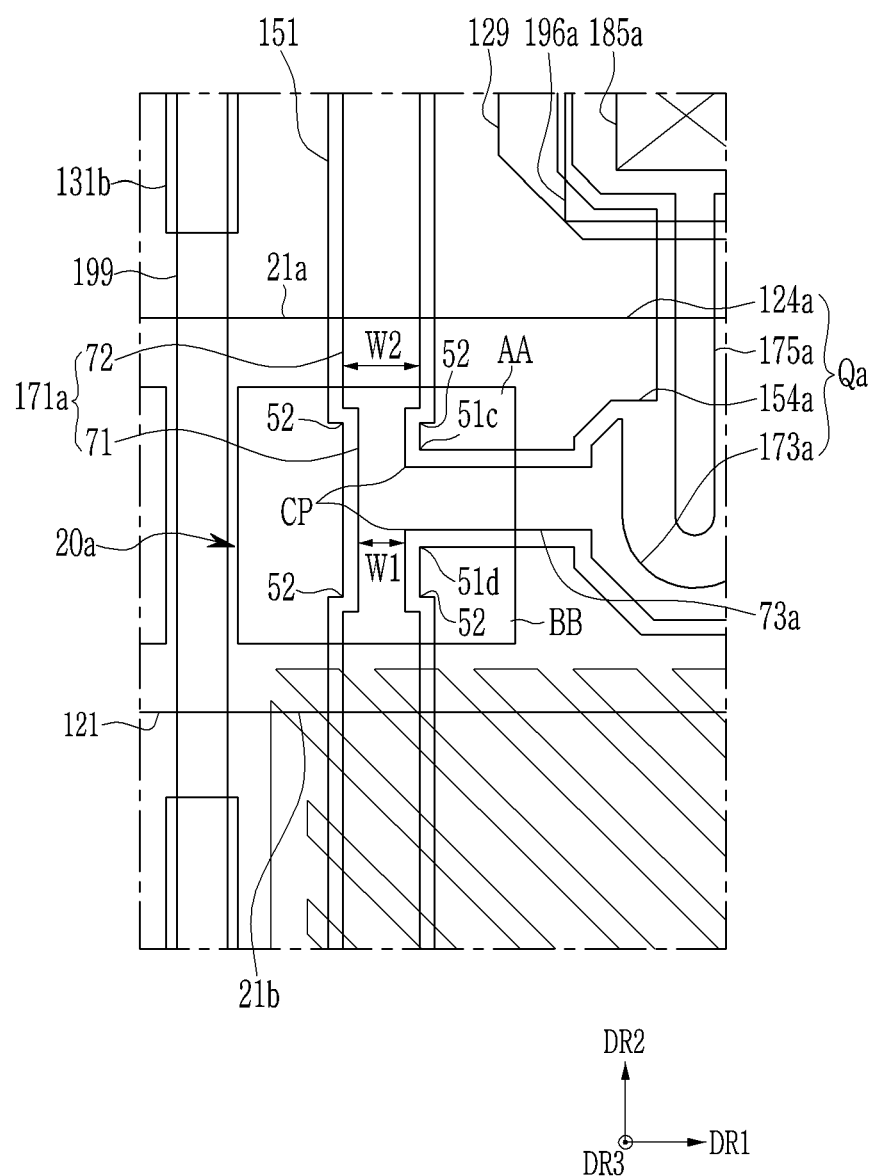
FIG. 5, FIG. 6, FIG. 7, and FIG. 8 are enlarged top plan views of a part of one pixel of a display device according to various exemplary embodiments.

First, referring to FIG. 5, the display device according to the present exemplary embodiment is substantially similar to the above-described display device except the shape of the data lines 171a and 171b near the connecting portion CP. Hereinafter, the first data line 171a and the connecting member 73a are described as an example, but the same structure may be applied to the second data line 171b and the connecting member 73b.

The data line 171a may include a main portion 72 crossing the line portions 21a and 21b of the gate line 121 and a thinner portion 71 that does not overlap the line portions 21a and 21b of the gate line 121 in a plan view. The thinner portion 71 may be disposed in the opening 20a between two line portions 21a and 21b of the gate line 121 in a plan view.

The connecting member 73a may be connected to the thinner portion 71, and the thinner portion 71 and the connecting member 73a may include the connecting portion CP. Both edges of the data line 171a are bent at a connection position of the main portion 72 and the thinner portion 71, thereby forming a curved edge. A width W1 of the thinner portion 71 may be smaller than a width W2 of the main portion 72. In one embodiment, the width W1 of the thinner portion 71 may be approximately 3 micrometers or more.

The edge of the semiconductor layer 151 is formed parallel to the edge of the data line 171a and the connecting member 73a, thereby having a curved edge 52 that is bent inwardly at the connection position of the main portion 72 and the thinner portion 71 of the data line 171a. Among the edges of the semiconductor layer 151, curved edges 51c and 51d that are bent corresponding to the connecting portion CP are adjacent to the curved edge 52 and may have a concave shape. That is, the curved edges 51c and 51d among the edges of the semiconductor layer 151 has the concave shape without protruding outwardly in the opening 20a, thereby the regions AA and BB may not be reduced. Accordingly, the patterning accuracy of the data conductive layer, the ohmic contact layer 161, and the semiconductor layer 151 near the connecting portion CP may be improved, and a sufficient margin for securing a space required for the laser irradiation in a repair process of the pixel PX may be obtained, thereby maintaining or increasing a success rate for repairing the pixel PX. Further, the undesirable outward protrusion of the semiconductor layer 151 may be suppressed or prevented near the connecting portion CP, thereby reducing or preventing an increase of the leakage current through the transistors Qa and Qb.

Differently from FIG. 5, depending on the performance of an exposure apparatus, the curved edges 51c and 51d of the semiconductor layer 151 may be formed substantially at right angles or rounded. In this case, the semiconductor layer 151 may not excessively protrude outwardly in the opening 20a such that a sufficient area of the regions AA and BB may be secured.

Figure 6:
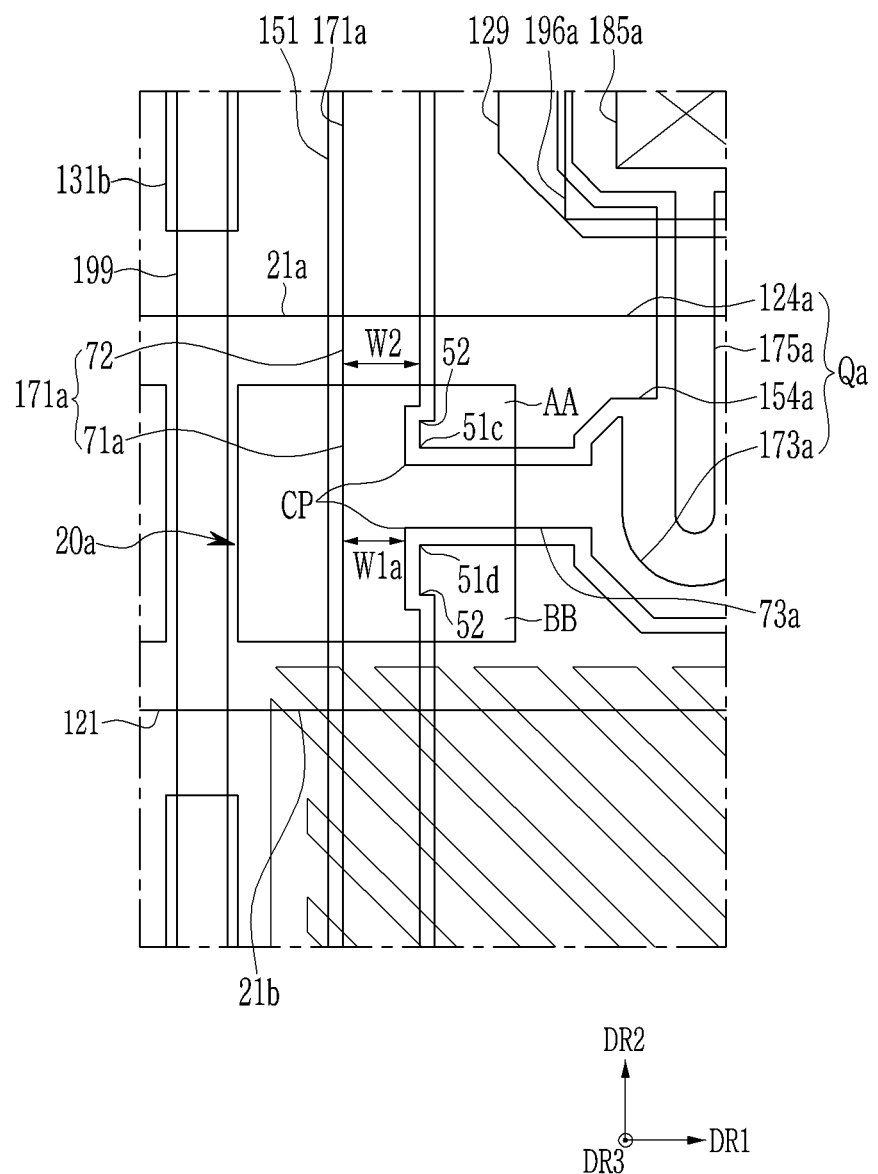

Next, referring to FIG. 6, the display device according to the present exemplary embodiment is substantially similar to the above-described display device shown in FIG. 5 except the shape of the data lines 171a and 171b near the connecting portion CP.

The data line 171a may include the above-described main portion 72 and a thinner portion 71a that does not overlap the line portions 21a and 21b of the gate line 121 in a plan view. The thinner portion 71a may be disposed in the opening 20a between two line portions 21a and 21b of the gate line 121 in a plan view. Unlike FIG. 5, among both edges of the data line 171a, only the edge directly connected to the connecting member 73a is bent at the connection position of the main portion 72 and the thinner portion 71a to form the curved edge, and the opposite edge is aligned with the edge of the main portion 72 to form a substantially straight line. A width W1a of the thinner portion 71a may be smaller than the width W2 of the main portion 72. In one embodiment, the width W1a of the thinner portion 71a may be approximately 3 micrometers or more.

The effect according to the exemplary embodiment shown in FIG. 6 may be substantially the same as the effect according to the exemplary embodiment shown in FIG. 5. That is, the semiconductor layer 151 may have the curved edge 52 that is bent at the connection position of the edge of the thinner portion 71a connected to the connecting member 73a and the edge of the main portion 72 of the data line 171a. Further, among the edges of the semiconductor layer 151, the curved edges 51c and 51d may be bent corresponding to the connecting portion CP to be adjacent to the curved edge 52 and have a concave shape. That is, the curved edges 51c and 51d of the semiconductor layer 151 have the concave shape without protruding outwardly, thereby the regions AA and BB may not be reduced. Accordingly, the patterning accuracy of the data conductive layer, the ohmic contact layer 161, and the semiconductor layer 151 near the connecting portion CP may be improved, and a sufficient margin for securing a space required for the laser irradiation in a repair process of the pixel PX may be obtained, thereby maintaining or increasing a success rate for repairing the pixel PX. Further, the undesirable outward protrusion of the semiconductor layer 151 may be suppressed or prevented near the connecting portion CP, thereby reducing or preventing an increase of the leakage current through the transistors Qa and Qb.

Differently from FIG. 6, depending on the performance of the exposure apparatus, the curved edges 51c and 51d of the semiconductor layer 151 may be formed substantially at right angles or rounded. In this case, the semiconductor layer 151 may not excessively protrude outwardly in the opening 20a such that a sufficient area of the regions AA and BB may be secured.

Figure 7:
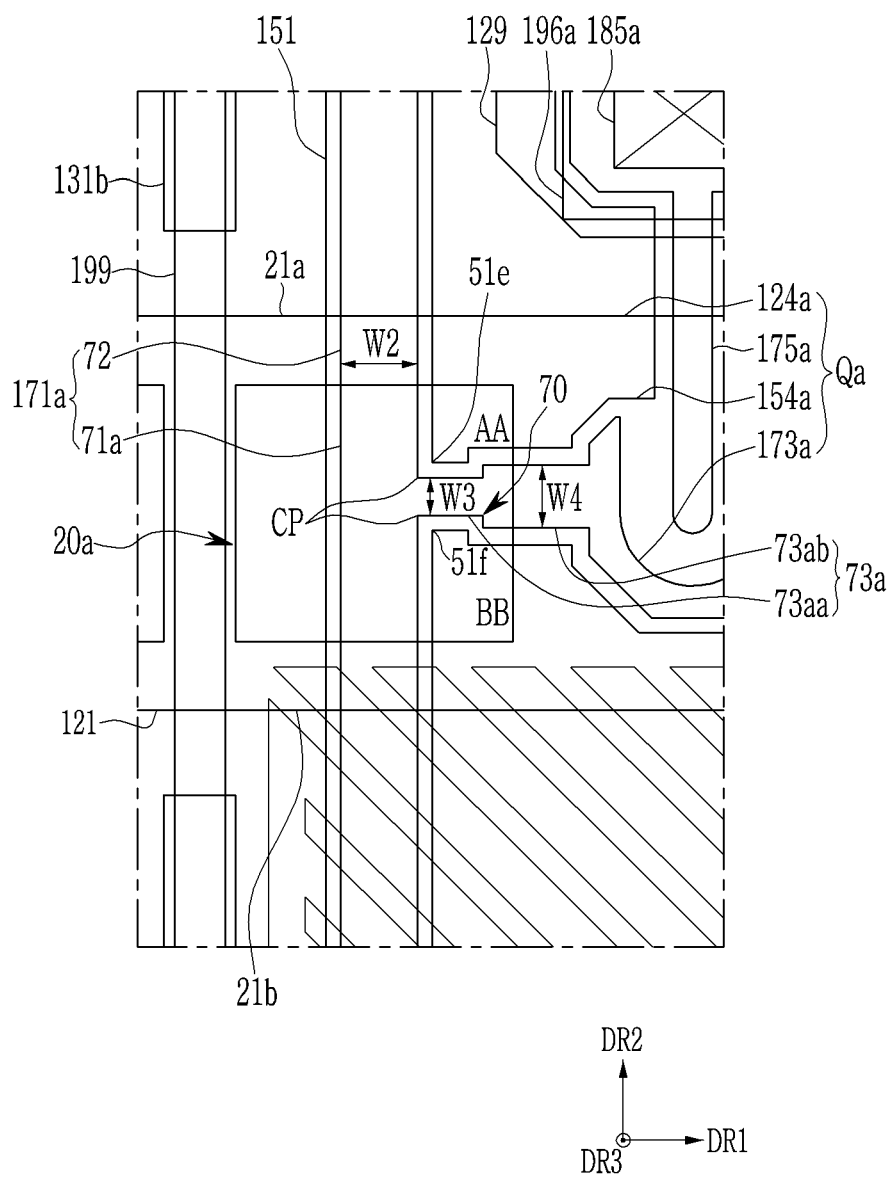

Next, referring to FIG. 7, the display device according to the present exemplary embodiment is substantially similar to the above-described exemplary embodiments except the shape of the connecting member 73a.

The connecting member 73a may include a thinner portion 73aa that is directly connected to the data line 171a and a main portion 73ab that is disposed between the thinner portion 73aa and the first source electrode 173a. Both edges of the connecting member 73a may be bent at the connection position of the main portion 73ab and the thinner portion 73aa to form a curved edge. The thinner portion 73aa may include the connecting portion CP. The thinner portion 73aa may be disposed in the opening 20a between two line portions 21a and 21b of the gate line 121 in a plan view. A width W3 of the thinner portion 73aa may be smaller than a width W4 of the main portion 73ab. In one embodiment, the width W3 of the thinner portion 73aa may be approximately 3 micrometers or more.

In other words, the connecting member 73a may include a recess portion 70 that is disposed near the connecting portion CP and connected to the data line 171a. A portion of the connecting member 73a including the recess portion 70 corresponds to the thinner portion 73aa.

The thinner portion 73aa or the recess portion 70 may not overlap the first gate electrode 124a in a plan view.

The semiconductor layer 151 may have curved edges 51e and 51f that are bent corresponding to the connecting portion CP to form a concave shape. The curved edges 51e and 51 of the semiconductor layer 151 has the concave shape without protruding outwardly in the opening 20a, thereby the regions AA and BB may not be reduced. Accordingly, the patterning accuracy of the data conductive layer, the ohmic contact layer 161, and the semiconductor layer 151 near the connecting portion CP may be improved, and a sufficient margin for securing a space required for the laser irradiation in a repair process of the pixel PX may be obtained, thereby maintaining or increasing a success rate for repairing the pixel PX. Further, the undesirable outward protrusion of the semiconductor layer 151 may be suppressed or prevented near the connecting portion CP, thereby reducing or preventing an increase of the leakage current through the transistors Qa and Qb.

Differently from FIG. 7, depending on the performance of the exposure apparatus, the curved edges 51e and 51f of the semiconductor layer 151 may be formed substantially at right angles or rounded. In this case, the semiconductor layer 151 is may not excessively protrude outwardly in the opening 20a such that a sufficient area of the regions AA and BB may be secured.

The data line 171a of the display device according to the present exemplary embodiment may have a substantially uniform thickness without including the thinner portions 71 and 71a.

Figure 8:
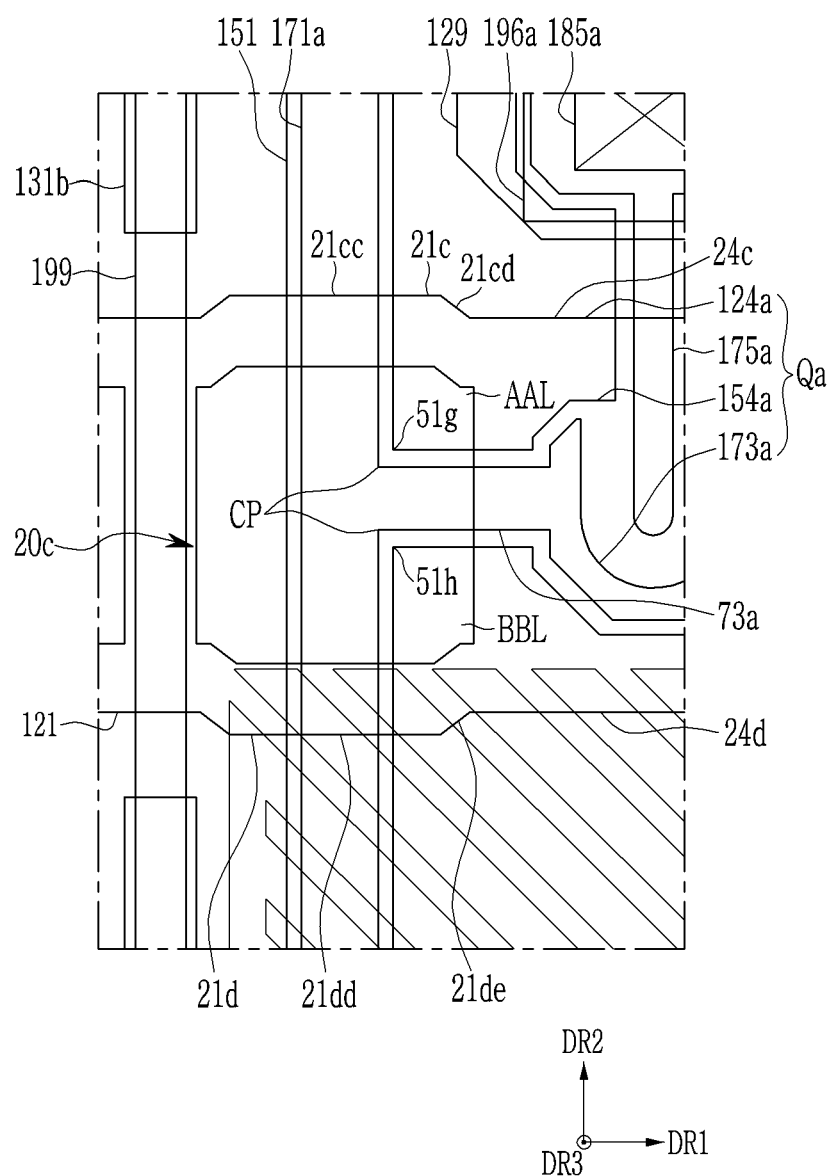

Next, referring to FIG. 8, the display device according to the present exemplary embodiment is substantially similar to the above-described exemplary embodiments except the shape of the gate line 121.

The gate line 121 may include line portions 21c and 21d that are disposed above and below an opening 20c facing each other. The line portions 21c and 21d may form a curved edge that is bent outwardly from the opening 20c, unlike the line portions 21a and 21b described above. Each line portion 21c and 21d may be folded at least twice.

Specifically, the line portion 21c may include an upper end edge 21cc extending substantially in the first direction DR1 and an oblique edge 21cd that is oblique with respect to the first direction DR1 and the second direction DR2. The upper end edge 21cc may be disposed on an outer side farther above than an upper end edge 24c of the first gate electrode 124a in a plan view, and the oblique edge 21cd may connect the upper end edge 21cc of the line portion 21c and the upper end edge 24c of the first gate electrode 124a.

The line portion 21d may include a lower end edge 21dd extending substantially in the first direction DR1 and an oblique edge 21de that is oblique with respect to the first direction DR1 and the second direction DR2. The lower end edge 21dd may be disposed on an outer side farther below than a lower end edge 24d of the first gate electrode 124a, and the oblique edge 21*de* may connect the lower end edge 21*dd* of the line portion 21*d* and the lower end edge 24*d* of the first gate electrode 124*a*.

A length of a protruded portion of the lower end edge 21*dd* that protrudes downwardly from the lower end edge 24*d* of the first gate electrode 124*a* may be similar to a length of a protruded portion of the lower edge of the second gate electrode 124*b* that protrudes downwardly from the line portion of the gate line 121. That is, the lower end edge 21*dd* may also be disposed in a region overlapping the light blocking member 220 described above.

The opening 20*c* of the gate line 121 overlapping the data line 171*a* may have a roughly octagonal or approximately a circular shape, not a quadrangular shape. Further, regions AAL and BBL enclosed by the data line 171*a*, the connecting member 73*a*, and the line portions 21*c* and 21*d* of the gate line 121 in the opening 20*c* may be increased compared to the regions AA and BB of the above-described exemplary embodiments.

According to one embodiment, a width of the line portions 21*c* and 21*d* can be substantially uniform.

The connecting portion CP may be disposed between the line portions 21*c* and 21*d* of the gate line 121 in a plan view.

Curved edges 51*g* and 51*h* corresponding to the connecting portion CP among the edges of the semiconductor layer 151 may have a concave shape and may protrude outwardly. However, since the line portions 21*c* and 21*d* of the gate line 121 defining the boundary of the region AAL and BBL are bent, the region AAL and BBL may not be substantially reduced compared with the regions AA and BB of the above-described exemplary embodiment. Accordingly, a sufficient margin for securing a space required for the laser irradiation in a repair process of the pixel PX may be obtained, thereby maintaining or increasing a success rate for repairing the pixel PX.

According to one embodiment, the data line 171*a* and the connecting member 73*a* may have a substantially uniform thickness in the vicinity of the gate line 121.

Figure 9:
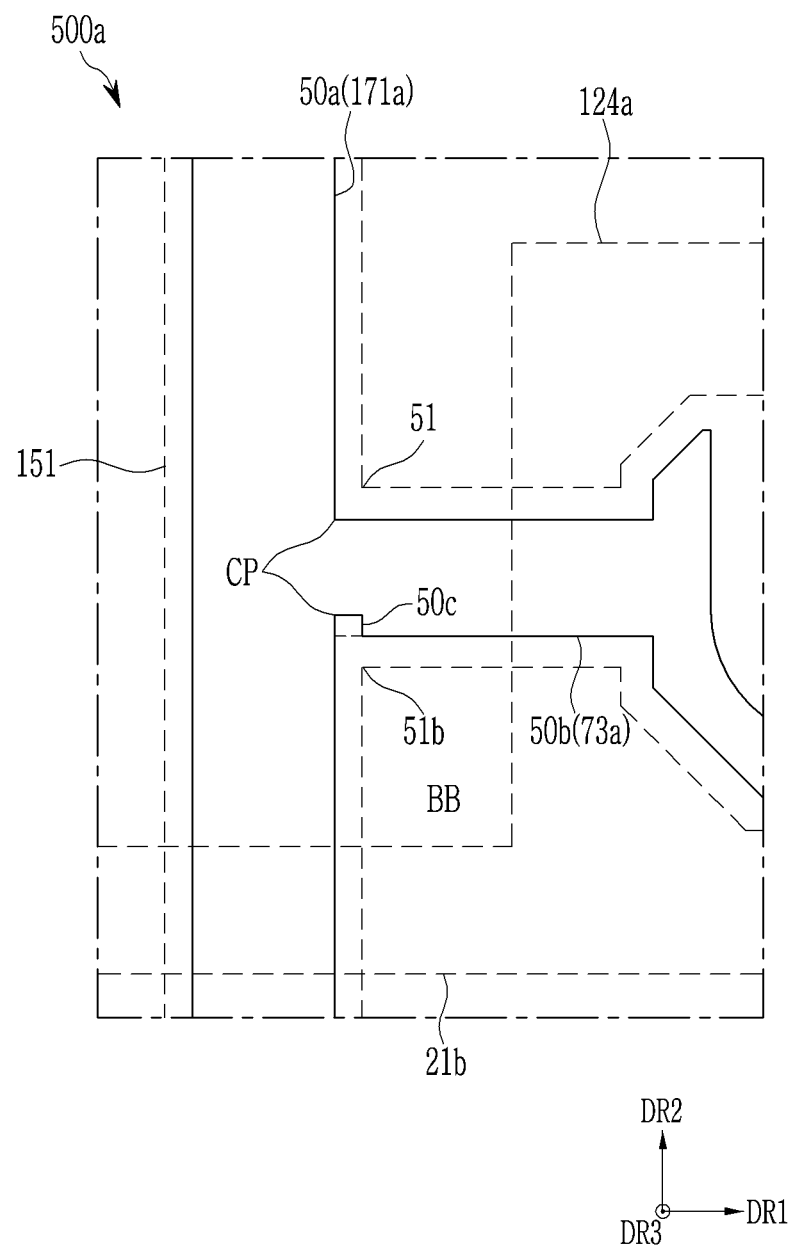
FIG. 9 is a top plan view showing a planar structure of a part of a photomask used in a manufacturing process of a display device according to an exemplary embodiment, and a pattern of the display device corresponding thereto.

FIG. 9 is a top plan view together showing a planar structure of a part of a photomask 500*a* used in a manufacturing process of a display device according to an exemplary embodiment, and a pattern (indicated by a dotted line) of the display device corresponding thereto.

Referring to FIG. 9, the display device to be manufactured through the photomask 500*a* according to the present exemplary embodiment is substantially similar to the above-described display device. For the convenience of illustration and explanation, the line portion 21*b* of the two line portions 21*a* and 21*b* of the gate line 121 is shown in FIG. 9. Accordingly, the region BB defined by the line portion 21*b* is shown in FIG. 9. Accordingly, the photomask 500*a* according to the present exemplary embodiment is substantially similar to the above-described photomask 500 except that the photomask 500*a* may include the corner pattern 50*c* corresponding to only the connecting portion CP that is disposed closer to the line portion 21*b* among a pair of connecting portions CP shown in FIG. 4.

The curved edge 51*b* that is bent corresponding to the connecting portion CP downwardly among the edges of the semiconductor layer 151 substantially parallel to the edge of the data line 171*a* and the connecting member 73*a* may form a concave shape, and the region BB enclosed by the data line 171*a*, the connecting member 73*a*, and the line portion 21*b* of the gate line 121 may not be reduced. Accordingly, the patterning accuracy of the data conductive layer, the ohmic contact layer 161, and the semiconductor layer 151 near the connecting portion CP may be improved, and a sufficient margin for securing a space required for the laser irradiation in a repair process of the pixel PX may be obtained, thereby maintaining or increasing a success rate for repairing the pixel PX. Further, the undesirable outward protrusion of the semiconductor layer 151 may be suppressed or prevented near the connecting portion CP, thereby reducing or preventing an increase of the leakage current through the transistors Qa and Qb.

In contrast, a curved edge 51 that is bent corresponding to the connecting portion CP at the upper side among the edges of the semiconductor layer 151 may have a different shape from the curved edge 51*b* corresponding to the connecting portion CP at the lower side. For example, the curved edge 51 may have a more rounded concave shape than the curved edge 51*b*, or may protrude outwardly.

Figure 10:
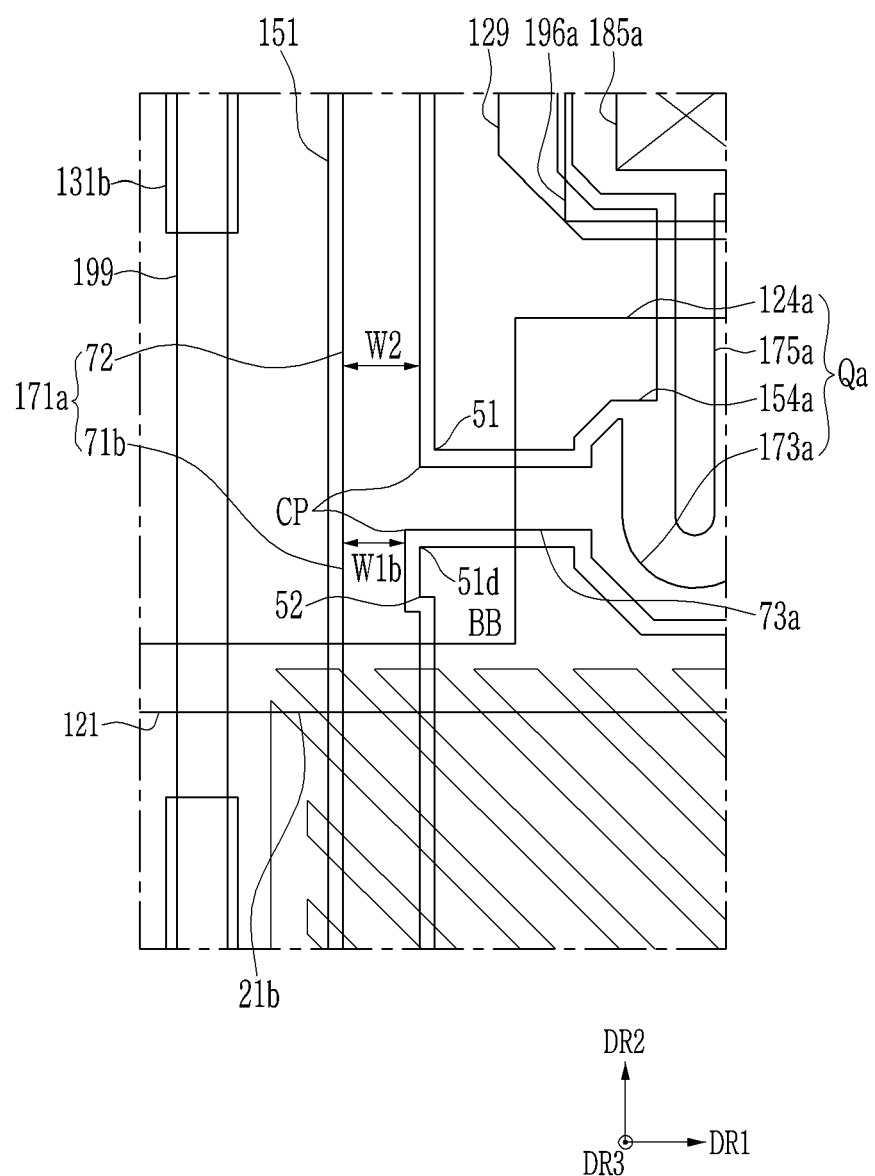
FIG. 10, FIG. 11, and FIG. 12 are enlarged top plan views of a part of one pixel of a display device according to an exemplary embodiment.
Figure 11:
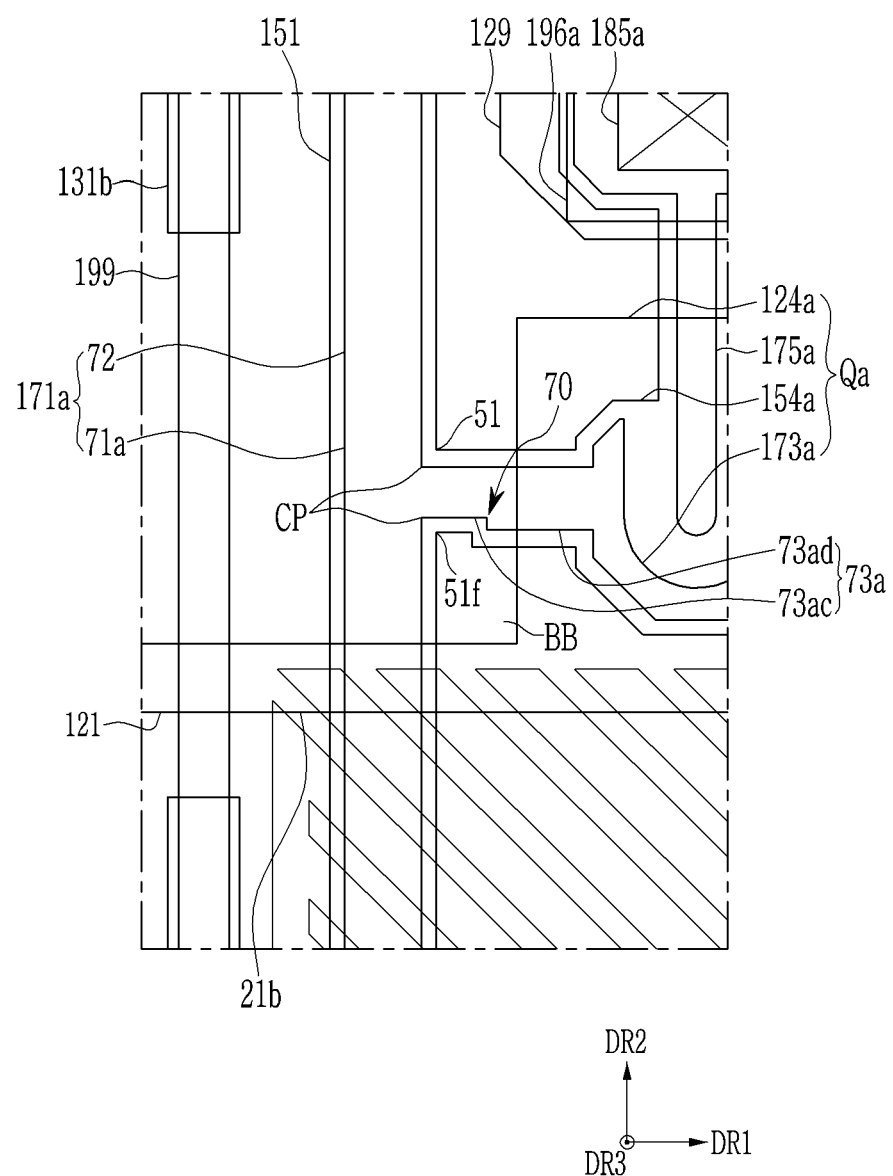
Figure 12:
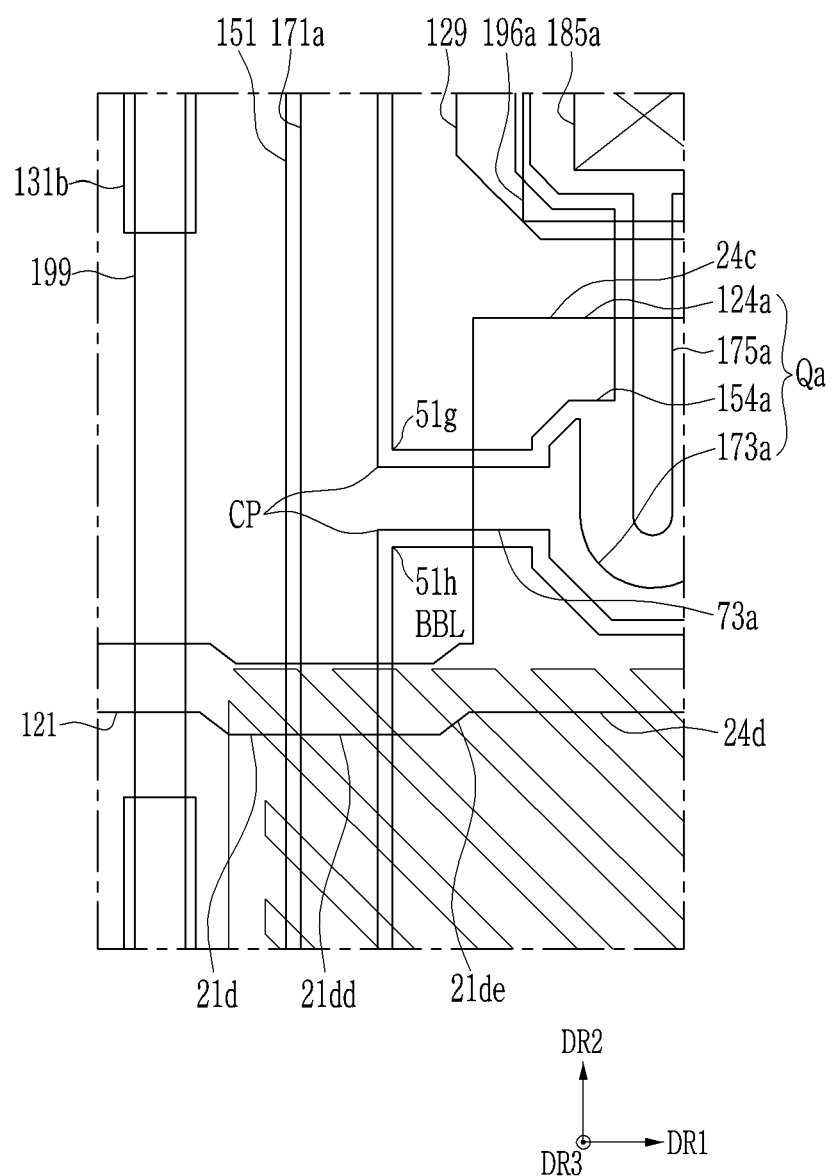

FIG. 10, FIG. 11, and FIG. 12 are enlarged top plan views of a part of one pixel of a display device according to an exemplary embodiment.

First, referring to FIG. 10, the display device according to the present exemplary embodiment is substantially similar to the display device according to the exemplary embodiment shown in FIG. 5 or FIG. 6 described above. For the convenience of illustration and explanation, the line portion 21*b* of two line portions 21*a* and 21*b* of the gate line 121 is shown in FIG. 10. Accordingly, the region BB defined by the line portion 21*b* is shown in FIG. 10.

The data line 171*a* according to the present exemplary embodiment may include a main portion 72 and a thinner portion 71*b* as above-described. Among both edges of the data line 171*a*, only the edge connected to the lower edge of the connecting member 73*a* is bent at the connection position of the main portion 72 and the thinner portion 71*b* to form a curved edge, and the opposite edge is substantially aligned with the edge of the main portion 72 to form a straight line. The thinner portion 71*b* may include the connecting portion CP. A width W1*b* of the thinner portion 71*b* may be smaller than a width W2 of the main portion 72. In one embodiment, the width of the thinner portion 71*b* may be approximately 3 micrometers or more.

The effect according to the exemplary embodiment shown in FIG. 10 may be substantially the same as the effect according to the exemplary embodiment shown in FIG. 5 or FIG. 6. That is, the semiconductor layer 151 may have the curved edge 52 that is bent at the connection position of the edge of the thinner portion 71*b* connected to the connecting member 73*a* and the edge of the main portion 72 of the data line 171*a*. Further, among the edges of the semiconductor layer 151, the curved edge 51*d* may be bent corresponding to the connecting portion CP of the lower side to be adjacent to the curved edge 52 and form a concave shape. That is, the curved edge 51*d* of the semiconductor layer 151 has the concave shape without protruding outwardly, thereby the region BB may not be reduced. Accordingly, the patterning accuracy of the data conductive layer, the ohmic contact layer 161, and the semiconductor layer 151 near the connecting portion CP may be improved, and a sufficient margin securing a space required for the laser irradiation onto the line portion 21*b* of the gate line 121 in a repair process of the pixel PX may be obtained, thereby maintaining or increasing a success rate for repairing the pixel PX. Further, an increase of the leakage current through the transistors Qa and Qb may be reduced or prevented by suppressing or preventing the undesirable outward protrusion of the semiconductor layer 151 near the connecting portion CP.

Among the edges of the semiconductor layer 151, the curved edge 51 that is bent corresponding to the connecting portion CP at the upper side may have a different shape from the curved edge 51d corresponding to the connecting portion CP at the lower side. For example, the curved edge 51 may have a more rounded concave shape than the curved edge 51d, or may protrude outwardly.

Now referring to FIG. 11, the display device according to the present exemplary embodiment is substantially similar to the display device according to the exemplary embodiment shown in FIG. 7. For the convenience of illustration and explanation, the line portion 21b of two line portions 21a and 21b of the gate line 121 is shown in FIG. 11. Accordingly, the region BB defined by the line portion 21b is shown in FIG. 11.

The connecting member 73a according to the present exemplary embodiment may include a thinner portion 73ac that is directly connected to the data line 171a, and a main portion 73ad that is disposed between the thinner portion 73ac and the first source electrode 173a. Among both edges of the connecting member 73a, the lower edge may be bent at the connection position of the main portion 73ad and the thinner portion 73ac to form a curved edge. The thinner portion 73ac may include the connecting portion CP. A width of the thinner portion 73ac may be smaller than a width of the main portion 73ad. In one embodiment, the width of the thinner portion 73ac may be approximately 3 micrometers or more.

In other words, the lower edge among both edges of the connecting member 73a may include a recess portion 70 that is disposed near the connecting portion CP and connected to the data line 171a. A portion of the connecting member 73a including the recess portion 70 corresponds to the thinner portion 73ac.

The semiconductor layer 151 may have the curved edge 51f that is bent corresponding to the connecting portion CP forming a concave shape. That is, the curved edge 51f of the semiconductor layer 151 has the concave shape without protruding outwardly, thereby the region BB may not be reduced. Accordingly, the patterning accuracy of the data conductive layer, the ohmic contact layer 161, and the semiconductor layer 151 near the connecting portion CP may be improved, and a sufficient margin for a space required for the laser irradiation onto the line portion 21b of the gate line 121 in a repair process of the pixel PX may be secured, thereby maintaining or increasing a success rate for repairing the pixel PX. Further, an increase of the leakage current through the transistors Qa and Qb may be reduced or prevented by suppressing or preventing the undesirable outward protrusion of the semiconductor layer 151 near the connecting portion CP.

Among the edges of the semiconductor layer 151, the curved edge 51 that is bent corresponding to the connecting portion CP at the upper side may have a different shape from the curved edge 51f corresponding to the connecting portion CP at the lower side. For example, the curved edge 51 may have a more rounded concave shape than the curved edge 51f, or may be protruded outward.

Now referring to FIG. 12, the display device according to the present exemplary embodiment is substantially similar to the display device according to the exemplary embodiment shown in FIG. 7, For the convenience of illustration and explanation, the line portion 21d of two line portions 21c and 21d of the gate line 121 is shown in FIG. 12. Accordingly, the region BBL defined by the line portion 21d is shown in FIG. 12.

Among the edges of the semiconductor layer 151, the curved edges 51g and 51h corresponding to the connecting portion CP may have a concave shape or may protrude outwardly. However, since the line portion 21d of the gate line 121 defining the boundary of the region BBL is curved outside, the region BBL may not be substantially reduced compared with the region BB of the above-described exemplary embodiment. Accordingly, a sufficient margin for securing a space required for the laser irradiation in a repair process of the pixel PX may be obtained, thereby maintaining or increasing a success rate for repairing the pixel PX.

Two or more features of the various exemplary embodiments described above may be applied simultaneously to the same display device.

While the present disclosure has been described in connection with some practical exemplary embodiments, it is to be understood that the present disclosure is not limited to the disclosed embodiments, but, on the contrary, is intended to cover various modifications and equivalent arrangements within the spirit and scope of the present disclosure.

What is claimed is:

1. A display device comprising:
   a gate line including a gate line portion and extending in a first direction;
   a data line extending in a second direction crossing the first direction;
   a transistor including a gate electrode connected to the gate line, a source electrode connected to the data line, and a drain electrode; and
   a connecting member disposed between the data line and the source electrode, connected to the data line and the source electrode, and extending in the first direction to cross a gate electrode edge of the gate electrode,
   wherein a connecting portion where a data line edge of the data line and a connecting member edge of the connecting member are connected to each other does not overlap the gate line and the gate electrode in a plan view,
   wherein the data line includes a first data line portion crossing the gate line and a second data line portion that is connected to the first data line portion and does not overlap the gate line in the plan view,
   wherein the second data line portion includes the connecting portion, and
   wherein a first width of the first data line portion is greater than a second width of the second data line portion.

2. The display device of claim 1, wherein
   the second data line portion of the data line is included in a region enclosed by the data line, the connecting member, the gate electrode edge, and the gate line portion of the gate line.

3. The display device of claim 2, wherein
   the data line includes two facing data line edges, and a first data line edge of the two facing data line edges is directly connected to the connecting member and is bent at a position where the first data line portion and the second data line portion are connected to form a curved edge.

4. The display device of claim 3, further comprising
   a semiconductor layer overlapping the data line, the connecting member, the source electrode, and the drain electrode,
   wherein the semiconductor layer includes a channel region disposed between the source electrode and the drain electrode.

5. The display device of claim 3, wherein
   the gate line portion of the gate line includes a first gate line portion and a second gate line portion facing each other with respect to the second data line portion.

6. The display device of claim 1, wherein
the connecting member includes a first connecting member portion connected to the data line and a second connecting member portion disposed between the first connecting member portion and the source electrode, and
a third width of the first connecting member portion is smaller than a fourth width of the second connection member portion.

7. The display device of claim 6, wherein
the first connecting member portion does not overlap the gate electrode in the plan view, and
the first connecting member portion of the connecting member is included in a region enclosed by the data line, the connecting member, the gate electrode edge, and the gate line portion of the gate line.

8. The display device of claim 7, wherein
the second connecting member portion crosses the gate electrode edge.

9. The display device of claim 1, wherein
the gate line portion of the gate line is bent to form a curved edge.

10. The display device of claim 9, wherein
the gate line portion has a uniform width.

11. The display device of claim 10, wherein
the curved edge of the gate line portion of the gate line is included in a region enclosed by the data line, the connecting member, the gate electrode edge, and the gate line portion of the gate line.

12. A display device comprising:
a gate line including a gate line portion and extending in a first direction;
a data line extending in a second direction crossing the first direction;
a transistor including a gate electrode connected to the gate line, a source electrode connected to the data line, and a drain electrode; and
a connecting member disposed between the data line and the source electrode, connected to the data line and the source electrode, and extending in the first direction to cross a gate electrode edge of the gate electrode,
wherein a connecting portion where a data line edge of the data line and a connecting member edge of the connecting member are connected to each other does not overlap the gate line and the gate electrode in a plan view,
wherein the connecting member includes a first connecting member portion connected to the data line and a second connecting member portion disposed between the first connecting member portion and the source electrode,
wherein the first connecting member portion includes the connecting portion, and
wherein a first width of the first connecting member portion is smaller than a second width of the second connecting member portion.

13. The display device of claim 12, wherein
the first connecting member portion does not overlap the gate electrode in the plan view.

14. The display device of claim 13, wherein
the first connecting member portion of the connecting member is included in a region enclosed by the data line, the connecting member, the gate electrode edge, and the gate line portion of the gate line.

15. The display device of claim 14, wherein
the second connecting member portion crosses the gate electrode edge.

16. The display device of claim 15, wherein
the gate line portion of the gate line includes a first gate line portion and a second gate line portion facing each other with respect to the first connecting member portion.

* * * * *